(12) United States Patent
Shen et al.

(10) Patent No.: US 7,536,629 B2
(45) Date of Patent: May 19, 2009

(54) CONSTRUCTION OF LDPC (LOW DENSITY PARITY CHECK) CODES USING GRS (GENERALIZED REED-SOLOMON) CODE

(75) Inventors: Ba-Zhong Shen, Irvine, CA (US); Scott Richard Powell, Carlsbad, CA (US); Kelly Brian Cameron, Irvine, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 609 days.

(21) Appl. No.: 11/190,333

(22) Filed: Jul. 27, 2005

(65) Prior Publication Data

US 2006/0156179 A1   Jul. 13, 2006

Related U.S. Application Data

(60) Provisional application No. 60/642,689, filed on Jan. 10, 2005.

(51) Int. Cl.
*H03M 12/00* (2006.01)

(52) U.S. Cl. .............. 714/781; 714/784; 714/799; 714/804

(58) Field of Classification Search ......... 714/781, 714/801, 758, 756, 784, 799, 803, 804, 724, 714/800
See application file for complete search history.

(56) References Cited

U.S. PATENT DOCUMENTS

| | | | |
|---|---|---|---|
| 3,542,756 A | 11/1970 | Gallager | |
| 3,665,396 A | 5/1972 | Forney, Jr. | |
| 4,295,218 A | 10/1981 | Tanner | |
| 6,430,233 B1 | 8/2002 | Dillon et al. | |
| 6,473,010 B1 | 10/2002 | Vityaev et al. | |
| 6,567,465 B2 | 5/2003 | Goldstein et al. | |
| 6,633,856 B2 | 10/2003 | Richardson et al. | |
| 7,191,376 B2* | 3/2007 | Yedidia | 714/751 |
| 7,334,181 B2* | 2/2008 | Eroz et al. | 714/801 |
| 2003/0104788 A1 | 6/2003 | Kim | |

OTHER PUBLICATIONS

I. Djurdjevic, J. Xu., K. Abdel-Ghaffar, and S. Lin, "A Class of Low-Density Parity-Check Codes Constructed Based on Reed-Solomon Codes with Two Information Symbols," IEEE Communications Letters, vol. 7, No. 7, Jul. 2003, pp. 317-319.

(Continued)

*Primary Examiner*—Guy J Lamarre
*Assistant Examiner*—Fritz Alphonse
(74) *Attorney, Agent, or Firm*—Garlick Harrison & Markison; Shayne X. Short

(57) ABSTRACT

Construction of LDPC (Low Density Parity Check) codes using GRS (Generalized Reed-Solomon) code. A novel approach is presented by which a GRS code may be employed to generate a wide variety of types of LDPC codes. Such GRS based LDPC codes may be employed within various types of transceiver devices implemented within communication systems. This approach may be employed to generate GRS based LDPC codes particular designed for various application arenas. As one example, such a GRS based LDPC code may be specifically designed for use in communication systems that operate in accordance with any standards and/or recommended practices of the IEEE P802.3an (10GBASE-T) Task Force.

29 Claims, 8 Drawing Sheets

OTHER PUBLICATIONS

F. J. MacWilliams, "The Theory of Error-Correcting Codes" 1997, North-Holland Mathematical Library, pp. 300-305.

Lei Chen, "Construction of Quasi-Cyclic LDPC Codes Based on the Minimum Weight Codewords of Reed-Solomon Codes" International Symposium, IEEE, Jun. 2004, pp. 239.

Shu Lin, "Structured Low-Density Parity-Check Codes: Algebraic Constructions" Jul. 2004, pp. 1-67.

Amin Shokrollahi, "LDPC Codes: An Introduction" Internet Article, Apr. 2003, pp. 1-34.

J. I. Hall, "Notes on Coding Theory," Dept. of Mathematics, Michigan State University, East Lansing, MI 48824 USA, Jan. 3, 2003—"Chapter 5: Generalized Reed-Solomon Codes" Internet Article, Jan. 3, 2003, pp. 63-76.

R. G. Gallager, "Low density parity check codes," IRE Trans. Info. Theory, vol. IT-8, pp. 21-28, Jan. 1962.

R. Gallager, Low-Density Parity-Check Codes, Cambridge, MA: MIT Press, 1963.

M. Luby, M. Mitzenmacher, M. A. Shokrollahi, D. A. Spielman, and V. Stemann, "Practical Loss-Resilient Codes", Proc. 29 th Symp. on Theory of Computing, 1997, pp. 150-159.

T. J. Richardson and R. L. Urbanke, "The capacity of low-density parity-check code under message-passing decoding," IEEE Trans. Inform. Theory, vol. 47, pp. 599-618, Feb. 2001.

J. I. Hall, "Notes on Coding Theory," Dept. of Mathematics, Michigan State University, East Lansing, MI 48824 USA, Jan. 3, 2003.

* cited by examiner

CONSTRUCTION OF LDPC (LOW DENSITY PARITY CHECK) CODES USING GRS (GENERALIZED REED-SOLOMON) CODE

CROSS REFERENCE TO RELATED PATENTS/PATENT APPLICATIONS

The present U.S. Utility Patent Application claims priority pursuant to 35 U.S.C. § 119(e) to the following U.S. Provisional Patent Application which is hereby incorporated herein by reference in its entirety and made part of the present U.S. Utility Patent Application for all purposes:

1. U.S. Provisional Application Ser. No. 60/642,689, entitled "Construction of LDPC (Low Density Parity Check) codes using generalized R-S (Reed-Solomon) code," filed Monday, Jan. 10, 2005 (Jan. 10, 2005), pending.

BACKGROUND OF THE INVENTION

1. Technical Field of the Invention

The invention relates generally to communication systems; and, more particularly, it relates to generation of coding that may be employed to generate coded signals for use in such communication systems.

2. Description of the Related Art

Data communication systems have been under continual development for many years. One such type of communication system that has been of significant interest lately is a communication system that employs iterative error correction codes. Of particular interest is a communication system that employs LDPC (Low Density Parity Check) code. Communications systems with iterative codes are often able to achieve lower bit error rates (BER) than alternative codes for a given signal to noise ratio (SNR).

A continual and primary directive in this area of development has been to try continually to lower the SNR required to achieve a given BER within a communication system. The ideal goal has been to try to reach Shannon's limit in a communication channel. Shannon's limit may be viewed as being the maximum possible data rate to be used in a communication channel, having a particular SNR (Signal to Noise Ratio), that achieves error free transmission through the communication channel. In other words, the Shannon limit is the theoretical bound for channel capacity for a given modulation and code rate.

LDPC code has been shown to provide for excellent decoding performance that can approach the Shannon limit in some cases. For example, some LDPC decoders have been shown to come within 0.3 dB (decibels) from the theoretical Shannon limit. While this example was achieved using an irregular LDPC code of a length of one million, it nevertheless demonstrates the very promising application of LDPC codes within communication systems.

The use of LDPC coded signals continues to be explored within many newer application areas. For example, the use of LDPC coded signals has been of significant concern within the IEEE (Institute of Electrical & Electronics Engineers) P802.3an (10GBASE-T) Task Force. This IEEE P802.3an (10GBASE-T) Task Force has been created by the IEEE to develop and standardize a copper 10 Giga-bit Ethernet standard that operates over twisted pair cabling according the IEEE 802.3 CSMA/CD Ethernet protocols. Carrier Sense Multiple Access/Collision Detect (CSMA/CD) is the protocol for carrier transmission access in Ethernet networks. IEEE 802.3an (10GBASE-T) is an emerging standard for 10 Gbps (Giga-bits per second) Ethernet operation over 4 wire twisted pair cables. More public information is available concerning the IEEE P802.3an (10GBASE-T) Task Force at the following Internet address:

"http://www.ieee802.org/3/an/".

This high data rate provided in such applications is relatively close to the theoretical maximum rate possible over the worst case 100 meter cable. Near-capacity achieving error correction codes are required to enable 10 Gbps operation. The latency constraints, which would be involved by using traditional concatenated codes, simply preclude their use in such applications.

Clearly, there is a need in the art for some alternative coding types and modulation implementations that can provide near-capacity achieving error correction. LDPC codes offer such performance.

There is no generally agreed "best" method to follow for the construction of LDPC codes with good performance. In the following reference, an LDPC code is constructed based on two codewords of an R-S (Reed-Solomon) code.

[a] I. Djurdjevic, J. Xu., K. Abdel-Ghaffar, and S. Lin, "A Class of Low-Density Parity-Check Codes Constructed Based on Reed-Solomon Codes with Two Information Symbols," *IEEE Communications Letters,* Vol. 7, No. 7, July 2003, pp. 317-319.

However, the LDPC codes presented using the approach of this prior art reference are of a very narrow type and there is very little, if any, flexibility presented by this approach by which other types of LDPC codes may be designed. This lack of flexibility presents a significant challenge for any design of such LDPC codes and/or communication devices to be implemented using such LDPC codes. Clearly, there seems to be a continual need for additional and better types of codes for use in various communication systems to provide for better means of error correction and better BER (Bit Error Rate) while operating at various amounts of SNR (Signal to Noise Ratio).

BRIEF SUMMARY OF THE INVENTION

The present invention is directed to apparatus and methods of operation that are further described in the following Brief Description of the Several Views of the Drawings, the Detailed Description of the Invention, and the claims. Other features and advantages of the present invention will become apparent from the following detailed description of the invention made with reference to the accompanying drawings.

DETAILED DESCRIPTION OF THE INVENTION

Figure 1:
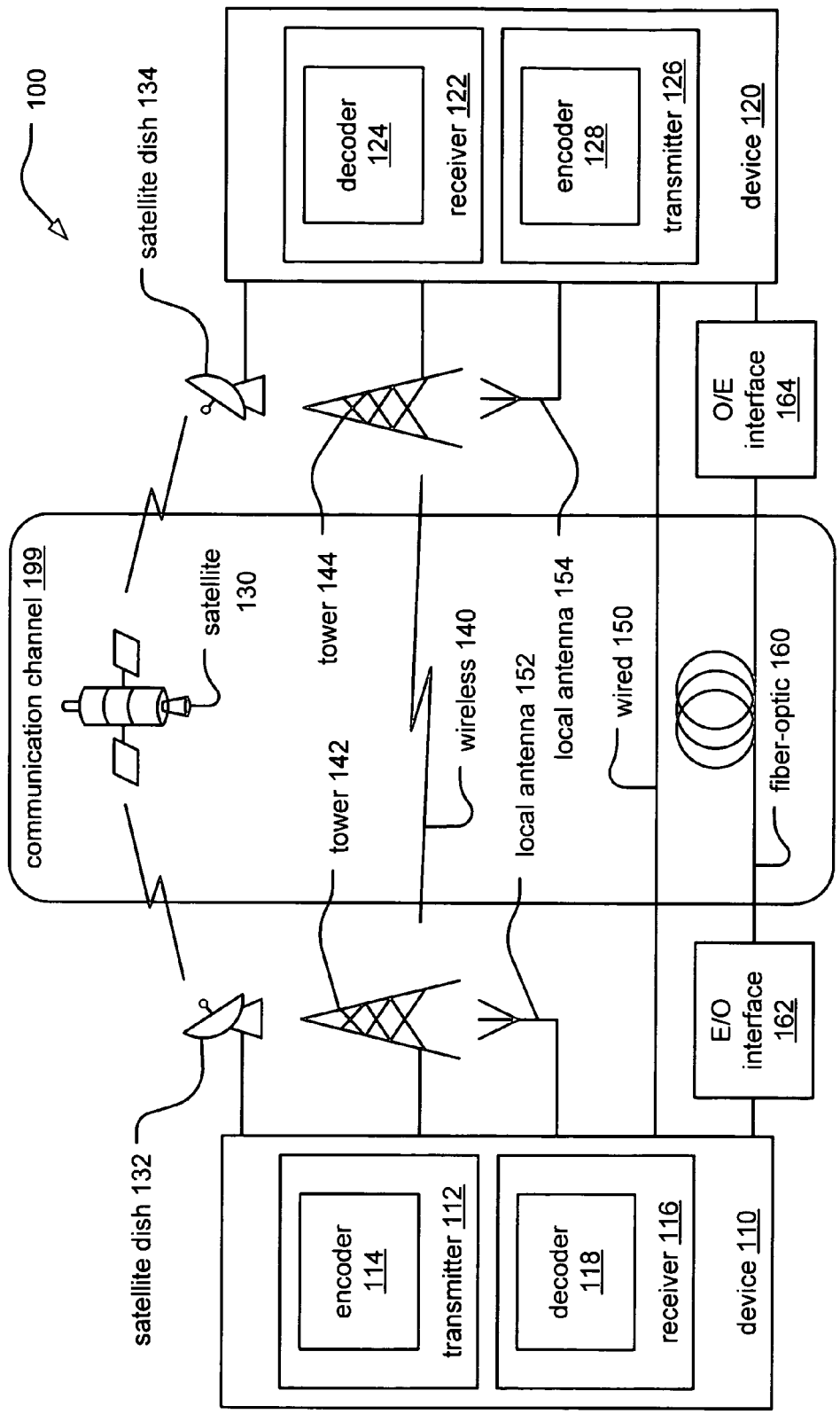
FIG. 1 and FIG. 2 are diagrams illustrating various embodiments of communication systems that may be built in accordance with certain aspects of the invention.

The goal of digital communications systems is to transmit digital data from one location, or subsystem, to another either error free or with an acceptably low error rate. As shown in FIG. 1, data may be transmitted over a variety of communications channels in a wide variety of communication systems: magnetic media, wireless, fiber, copper, and other types of media as well.

Figure 2:
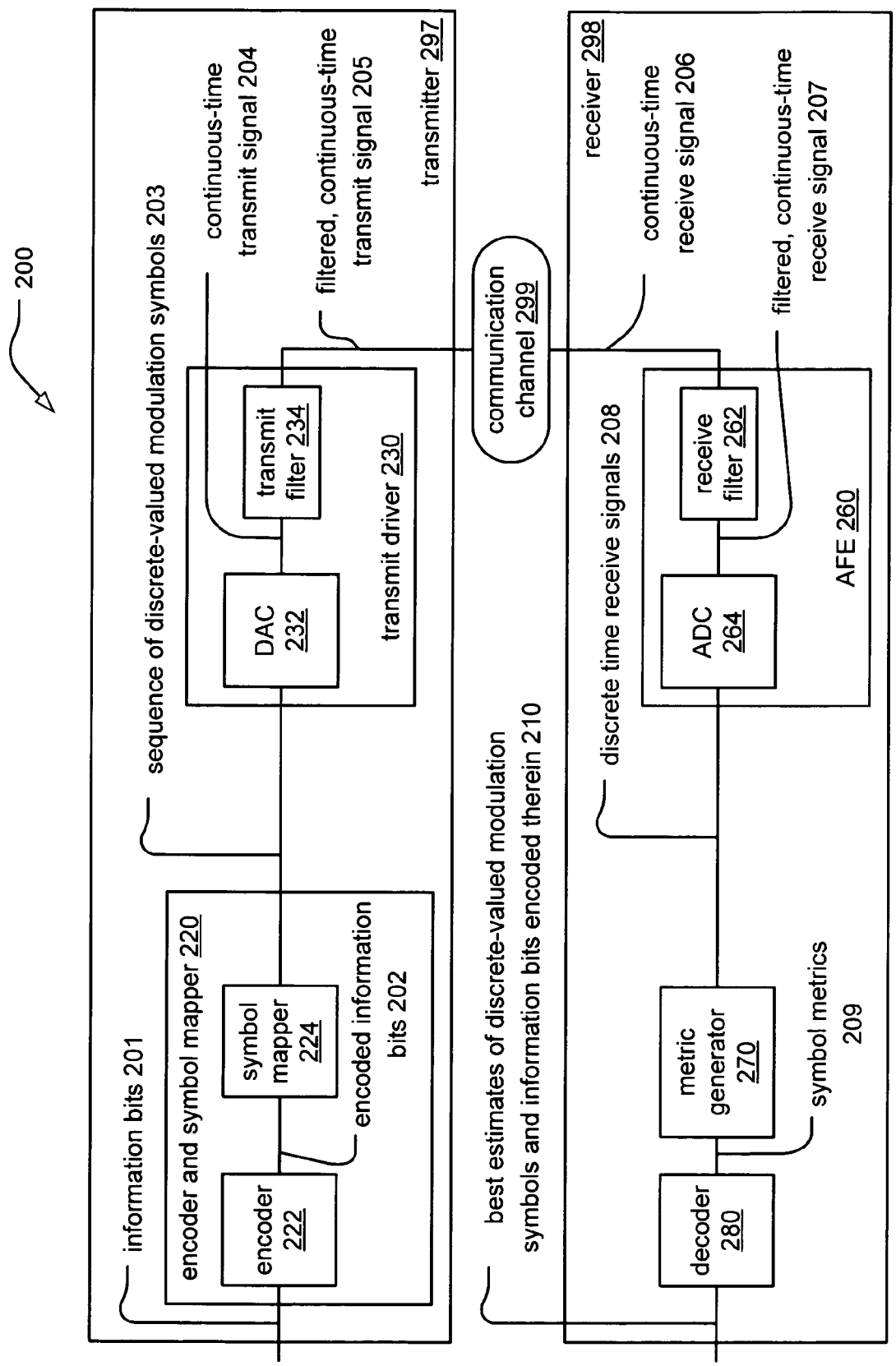

FIG. 1 and FIG. 2 are diagrams illustrating various embodiments of communication systems, 100 and 200, respectively, that may be built in accordance with certain aspects of the invention.

Referring to FIG. 1, this embodiment of a communication system 100 is a communication channel 199 that communicatively couples a communication device 110 (including a transmitter 112 having an encoder 114 and including a receiver 116 having a decoder 118) situated at one end of the communication channel 199 to another communication device 120 (including a transmitter 126 having an encoder 128 and including a receiver 122 having a decoder 124) at the other end of the communication channel 199. In some embodiments, either of the communication devices 110 and 120 may only include a transmitter or a receiver. There are several different types of media by which the communication channel 199 may be implemented (e.g., a satellite communication channel 130 using satellite dishes 132 and 134, a wireless communication channel 140 using towers 142 and 144 and/or local antennae 152 and 154, a wired communication channel 150, and/or a fiber-optic communication channel 160 using electrical to optical (E/O) interface 162 and optical to electrical (O/E) interface 164)). In addition, more than one type of media may be implemented and interfaced together thereby forming the communication channel 199.

To reduce transmission errors that may undesirably be incurred within a communication system, error correction and channel coding schemes are often employed. Generally, these error correction and channel coding schemes involve the use of an encoder at the transmitter and a decoder at the receiver.

Referring to the communication system 200 of FIG. 2, at a transmitting end of a communication channel 299, information bits 201 are provided to a transmitter 297 that is operable to perform encoding of these information bits 201 using an encoder and symbol mapper 220 (which may be viewed as being distinct functional blocks 222 and 224, respectively) thereby generating a sequence of discrete-valued modulation symbols 203 tat is provided to a transmit driver 230 that uses a DAC (Digital to Analog Converter) 232 to generate a continuous-time transmit signal 204 and a transmit filter 234 to generate a filtered, continuous-time transmit signal 205 that substantially comports with the communication channel 299. At a receiving end of the communication channel 299, continuous-time receive signal 206 is provided to an AFE (Analog Front End) 260 that includes a receive filter 262 (that generates a filtered, continuous-time receive signal 207) and an ADC (Analog to Digital Converter) 264 (that generates discrete-time receive signals 208). A metric generator 270 calculates symbol metrics 209 that are employed by a decoder 280 to make best estimates of the discrete-valued modulation symbols and information bits encoded therein 210.

The decoders of either of the previous embodiments may be implemented to include various aspects of the invention therein. In addition, several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signal. Before more details are provided below, a general description of LDPC codes is provided.

Several of the following Figures describe other and particular embodiments (some in more detail) that may be used to support the devices, systems, functionality and/or methods that may be implemented in accordance with certain aspects of the invention. One particular type of signal that is processed according to certain aspects of the invention is an LDPC coded signals. Before more details are provided below, a general description of LDPC codes is provided.

Figure 3:
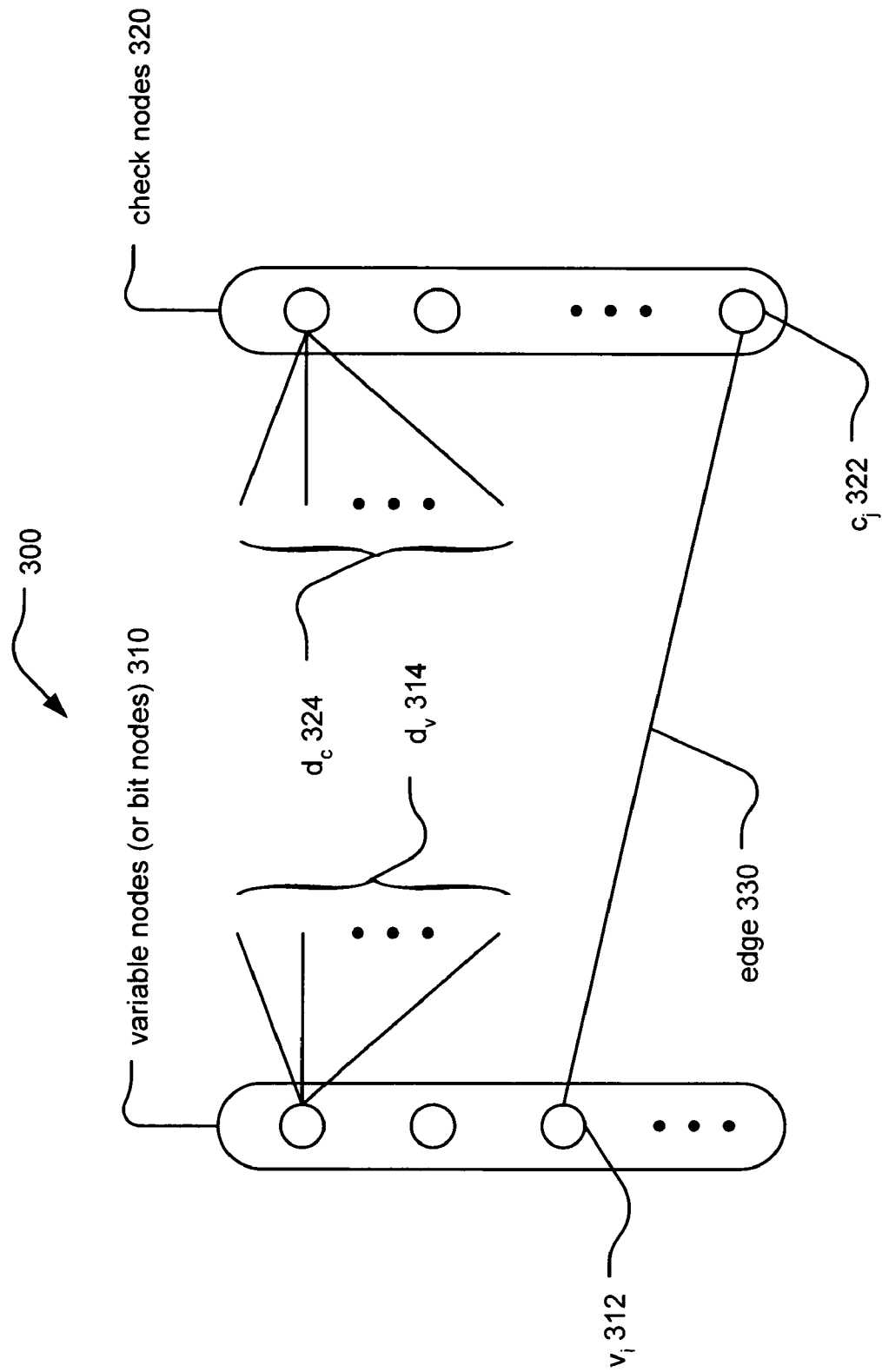
FIG. 3 is a diagram illustrating an embodiment of an LDPC (Low Density Parity Check) code bipartite graph.

FIG. 3 is a diagram illustrating an embodiment of an LDPC (Low Density Parity Check) code bipartite graph 300. In the art, an LDPC bipartite graph may also sometimes be referred to as a Tanner graph. An LDPC code may be viewed as being a code having a binary parity check matrix such that nearly all of the elements of the matrix have values of zeroes (e.g., the binary parity check matrix is sparse). For example, $H=(h_{i,j})_{M \times N}$ may be viewed as being a parity check matrix of an LDPC code with block length N.

The number of 1's in the i-th column of the parity check matrix may be denoted as $d_v(i)$, and the number of 1's in the j-th row of the parity check matrix may be denoted as $d_c(j)$. If $d_v(i)=d_v$ for all i, and $d_c(j)=d_c$ for all j, then the LDPC code is called a $(d_v,d_c)$ regular LDPC code, otherwise the LDPC code is called an irregular LDPC code.

LDPC codes were introduced by R. Gallager in [1] referenced below and by M. Luby et al. in [2] also referenced below.

[1] R. Gallager, *Low-Density Parity-Check Codes*, Cambridge, MA: MIT Press, 1963.

[2] M. Luby, M. Mitzenmacher, M. A. Shokrollahi, D. A. Spielman, and V. Stemann, "Practical Loss-Resilient Codes", Proc. $29^{th}$ Symp. on Theory of Computing, 1997, pp. 150-159.

A regular LDPC code can be represented as a bipartite graph 300 by its parity check matrix with left side nodes representing variable of the code bits (or alternatively as the "variable nodes" (or "bit nodes") 310 in a bit decoding approach to decoding LDPC coded signals), and the right side nodes representing check equations (or alternatively as the "check nodes" 320). The bipartite graph 300 of the LDPC code defined by H may be defined by N variable nodes (e.g., N bit nodes) and M check nodes. Every variable node of the N variable nodes 310 has exactly $d_v(i)$ edges (an example edge shown using reference numeral 330) connecting the bit node, $v_i$ 312, to one or more of the check nodes (within the M check nodes). The edge 310 is specifically shown as connecting from the bit node, $v_i$ 312, to the check node, $c_j$ 322. This number of $d_v$ edges (shown as $d_v$ 314) may be referred to as the degree of a variable node i. Analogously, every check node of the M check nodes 1520 has exactly $d_c(j)$ edges (shown as $d_c$ 324) connecting this node to one or more of the variable nodes (or bit nodes) 310. This number of edges, $d_c$, may be referred to as the degree of the check node j.

An edge 330 between a variable node $v_i$ (or bit node $b_i$) 312 and check node $c_j$ 322 may be defined by e=(i,j). However, on the other hand, given an edge e=(i,j), the nodes of the edge may alternatively be denoted as by e=(v(e),c(e)) (or e=(b(e),c(e))). Given a variable node $v_i$ (or bit node $b_i$), one may define the set of edges emitting from the node $v_i$ (or bit node $b_i$) by $E_v(i)=\{e|v(e)=i\}$ (or by $E_b(i)=\{e|b(e)=i\}$). Given a check node $c_j$, one may define the set of edges emitting from the node $c_j$ by $E_c(j)=\{e|c(e)=j\}$. Continuing on, the derivative result will be $|E_v(i)|=d_v$ (or $|E_b(i)|=d_b$) and $|E_c(j)|=d_c$.

Generally speaking, any codes that can be represented by a bipartite graph may be characterized as graph codes. It is also noted that an irregular LDPC code may also described using a bipartite graph. However, the degree of each set of nodes within an irregular LDPC code may be chosen according to some distribution. Therefore, for two different variable nodes, $v_{i_1}$ and $v_{i_2}$, of an irregular LDPC code, $|E_v(i_1)|$ may not equal to $|E_v(i_2)|$. This relationship may also hold true for two check nodes. The concept of irregular LDPC codes was originally introduced within M. Luby et al. in [2] referenced above.

In general, with a graph of an LDPC code, the parameters of an LDPC code can be defined by a degree of distribution, as described within M. Luby et al. in [2] referenced above and also within the following reference [3]:

[3] T. J. Richardson and R. L. Urbanke, "The capacity of low-density parity-check code under message-passing decoding," *IEEE Trans. Inform. Theory*, Vol. 47, pp. 599-618, February 2001.

This distribution may be described as follows:

Let $\lambda_i$ represent the fraction of edges emanating from variable nodes of degree i and let $\rho_i$ represent the fraction of edges emanating from check nodes of degree i. Then, a degree distribution pair $(\lambda,\rho)$ is defined as follows:

$$\lambda(x) = \sum_{i=2}^{M_v} \lambda_i x^{i-1} \text{ and } \rho(x) = \sum_{i=2}^{M_c} \rho_i x^{i-1},$$

where $M_v$ and $M_c$ represent the maximal degrees for variable nodes and check nodes, respectively.

While many of the illustrative embodiments described herein utilize regular LDPC code examples, it is noted that certain aspects of the invention are also operable to accommodate both regular LDPC codes and irregular LDPC codes.

As mentioned above in the Djurdjevic, et al. reference [a], a narrow type of LDPC codes is constructed based on two codewords of an R-S (Reed-Solomon) code.

In contradistinction, this disclosure presents an approach by which a broad range of LDPC codes may be generated using various types of R-S codes including those having a broad range and number of information symbols. In one embodiment, this disclosure presents an approach by which an LDPC code may be generated using a GRS (Generalized Reed-Solomon) code.

This novel approach presented herein, using the GRS code to generate the LDPC code, provides much more flexibility to designers of LDPC coded signals as well as communication devices that are implemented to perform processing of such LDPC coded signals (including transmitter end devices and receiver end devices and/or transceiver devices). The construction approach presented herein provides for a much broader choice of the types of LDPC codes to be generated.

One embodiment of constructing such LDPC codes is first presented.

The construction approach of such LDPC codes may be understood by considering a Galois field, $GF(2^s)$, and any number, $\rho$, such that $\rho \leq 2^s$.

Step 1: randomly select a location set, L, such that $L=\{\alpha^{i_0}, \ldots, \alpha^{i_{\rho-1}}\}$ has $\rho$ elements and two random selected degree 1 polynomials, $f_0$ and $f_1$, such that $f_0(\lambda) \neq 0$ for all $\lambda \in L$, and $f_1(x) \neq \beta \cdot f_0(x)$ for all $\beta \in GF(2^s)$.

Step 2: randomly select $\rho$ non-zero elements, $v_0, v_1, \ldots, v_{\rho-1}$, from the Galois field, $GF(2^s)$.

Step 3: take two codewords, that are depicted as follows:

$$c_0=(v_0 f_0(\alpha^{i_0}), v_1 f_0(\alpha^{i_1}), \ldots, v_{\rho-1} f_0(\alpha^{i_{\rho-1}}))$$

$$c_1=(v_0 f_1(\alpha^{i_0}), v_1 f_1(\alpha^{i_1}), \ldots, v_{\rho-1} f_1(\alpha^{i_{\rho-1}}))$$

As an example of a 32 bit finite precision implementation, these two codeword vectors could be represented as follows:

$$c_0=(v_0 f_0(\alpha^{i_0}), v_1 f_0(\alpha^{i_1}), \ldots, v_{31} f_0(\alpha^{i_{31}}))$$

$$c_1=(v_0 f_1(\alpha^{i_0}), v_1 f_1(\alpha^{i_1}), \ldots, v_{31} f_1(\alpha^{i_{31}}))$$

It is shown in the following reference [4] that such as 2-dimensional code generated by these two codewords, $c_0$ and $c_1$, has a minimum distance, $d_{min}$, of $\rho$-1.

[4] F. J. MacWilliams and N. J. A. Sloane, *The Theory of Error-Correcting Codes*, North-Holland Mathematical Library, North-Holland, N.Y., 1998.

Step 4: there are then $2^s$ possible cosets, $(c_0)+\beta \cdot c_1$, where $\beta$ is within the Galois field, i.e., $\beta \in GF(2^s)$.

Then, using this design approach presented above according to certain aspects of the invention, any of a variety of LDPC codes may be constructed using aspects of the design presented by the Djurdjevic, et al. reference.

One embodiment of a construction approach to generate an R-S based LDPC code (e.g., a GRS based LDPC code) in accordance that is implemented in accordance with certain aspects of the invention is presented as follows:

Cosets $C^{(i)}=\{c_1, C_2, \ldots, c_{2^s-1}\}$, such that each $c_k = \{c_{k,0}, c_{k,1}, \ldots, c_{k,\rho}\}$ Location map: using the Galois field, $GF(2^s) \rightarrow \{0,1\}^{2^s}$ $z(0)=(100 \ldots 0)$, $z(1)=(010 \ldots 0)$, $z(\alpha)=(001 \ldots 0)$, ...

$z(\alpha^i)=(000 \ldots 010 \ldots 0)$, where 1 is in the i+2-th position.

A $2^s \times 2^s$ permutation matrix is provided as follows:

$$P_{i,k} = \begin{bmatrix} z(c_{k,0}) \\ z(c_{k,1}) \\ \vdots \\ z(c_{k,2^s-1}) \end{bmatrix}$$

The LDPC code may be generated using the following LDPC matrix:

$$H(\gamma) = \begin{bmatrix} P_{1,1} & P_{1,2} & \cdots & P_{1,\rho} \\ P_{2,1} & P_{2,2} & \cdots & P_{2,\rho} \\ \vdots & \vdots & \ddots & \vdots \\ P_{\gamma,1} & P_{\gamma,2} & \cdots & P_{\gamma,\rho} \end{bmatrix}$$

Some of the properties of the matrix are provided as follows:

1. every column has a weight of $\gamma$
2. every row has a weight of $\rho$
3. no two rows have mode than 1-component in common Also, the bit node degree of such an LDPC code constructed using this approach is $\gamma$, and the check node degree of such an LDPC code constructed using this approach is $\rho$.

The minimum distance, $d_{min}$, of such an LDPC code is provided as follows:

$$d_{min} \geq \begin{cases} \gamma+2 & \text{even } \gamma \\ \gamma+1 & \text{odd } \gamma \end{cases}$$

EXAMPLE

Root LDPC Code (See APPENDIX A Below)

An example of one possible LDPC code that may be generated using this approach is presented.

Using this approach of generating an LDPC code using GRS code, there are at least $64 \times 32 \times 64 = 131,072$ different kinds of LDPC codes that may be constructed. Therefore, it has enough randomness.

The Galois field that is selected is depicted as follows: $GF(2^6)$.

Step 1: One of the random selected degree 1 polynomials, $f_0$, may be represented as 0103 (octal), or alternatively using the polynomial $f_0(x)=x^6+x+1$. In addition, the primitive element, $\alpha$, may be represented as 2 (octal), or alternatively as simply: $\alpha=x$.

Step 2: randomly select $\rho$ non-zero elements, $v_0, v_1, \ldots, v_{\rho-1}$, from the Galois field, $GF(2^s)$. In this Root LDPC code example, the number $\rho$ of non-zero elements is selected to be 32.

Step 3: take two codewords, that are depicted in a 32 bit finite precision implementation as follows:

$c_0 = (v_0 f_0(\alpha^{i0}), v_1 f_0(\alpha^{i1}), \ldots, v_{31} f_0(\alpha^{i31}))$ $c_1 = (v_0 f_1(\alpha^{i0}), v_1 f_1(\alpha^{i1}), \ldots, v_{31} f_1(\alpha^{i31}))$ These two (2) R-S codewords from a corresponding 2-D R-S code generator matrix, G, may be depicted as follows:

A: 24, 7, 62, 30, 32, 39, 1, 2, 50, 2, 26, 34, 44, 39, 14, 19, 38, 20, 18, 38, 62, 18, 50, 32, 42, 35, 27, 45, 0, 31, 21, 1.

B: 24, 34, 53, 34, 1, 46, 31, 48, 55, 38, 61, 12, 47, 21, 62, 56, 31, 22, 17, 14, 32, 41, 27, 52, 4, 51, 38, 40, 28, 41, 0, −1.

where the number x, such that x>−1 represents $\alpha^x$ in the codeword and −1 represents 0 in the codeword. Clearly, $\alpha^1 = \alpha$ and $\alpha^0 = 1$.

For example, the codewords, A and B, may be represented as follows:

$$A = \begin{pmatrix} \alpha^{24}, \alpha^7, \alpha^{62}, \alpha^{30}, \alpha^{32}, \alpha^{39}, \alpha, \alpha^2, \alpha^{50}, \alpha^2, \alpha^{26}, \alpha^{34}, \alpha^{44}, \alpha^{39}, \alpha^{14}, \\ \alpha^{19}, \alpha^{38}, \alpha^{20}, \alpha^{18}, \alpha^{38}, \alpha^{62}, \alpha^{18}, \alpha^{50}, \alpha^{32}, \alpha^{42}, \alpha^{35}, \alpha^{27}, \alpha^{45}, 1, \alpha^{31}, \alpha^{21}, \alpha \end{pmatrix}$$

$$B = \begin{pmatrix} \alpha^{24}, \alpha^{34}, \alpha^{53}, \alpha^{34}, \alpha, \alpha^{46}, \alpha^{31}, \alpha^{48}, \alpha^{55}, \alpha^{38}, \alpha^{61}, \alpha^{12}, \alpha^{47}, \alpha^{21}, \alpha^{62}, \\ \alpha^{56}, \alpha^{31}, \alpha^{22}, \alpha^{17}, \alpha^{14}, \alpha^{32}, \alpha^{41}, \alpha^{27}, \alpha^{52}, \alpha^4, \alpha^{51}, \alpha^{38}, \alpha^{40}, \alpha^{28}, \alpha^{41}, 1, 0 \end{pmatrix}$$

Accordingly, there are at least 64 possible choices that may be made.

Two (2) GRS codewords that may be generated are depicted as follows:

$$c_0 = \begin{pmatrix} \alpha^{24}, \alpha^7, \alpha^{62}, \alpha^{30}, \alpha^{32}, \alpha^{39}, \alpha, \alpha^2, \alpha^{50}, \alpha^2, \alpha^{26}, \alpha^{34}, \alpha^{44}, \alpha^{39}, \alpha^{14}, \\ \alpha^{19}, \alpha^{38}, \alpha^{39}, \alpha^{18}, \alpha^{38}, \alpha^{62}, \alpha^{18}, \alpha^{50}, \alpha^{32}, \alpha^{42}, \alpha^{35}, \alpha^{27}, \alpha^{45}, 1, \alpha^{31}, \alpha^{21}, \alpha \end{pmatrix};$$

-continued $$c_1 = \begin{pmatrix} \alpha^{24}, \alpha^{34}, \alpha^{53}, \alpha^{34}, \alpha, \alpha^{46}, \alpha^{31}, \alpha^{48}, \alpha^{55}, \alpha^{38}, \alpha^{61}, \alpha^{12}, \alpha^{47}, \alpha^{21}, \alpha^{62}, \\ \alpha^{56}, \alpha^{31}, \alpha^{41}, \alpha^{17}, \alpha^{14}, \alpha^{32}, \alpha^{41}, \alpha^{27}, \alpha^{52}, \alpha^{4}, \alpha^{51}, \alpha^{38}, \alpha^{40}, \alpha^{28}, \alpha^{41}, 1, 0 \end{pmatrix}.$$

These two (2) GRS codewords may alternatively be depicted with respect to the codewords, A and B, as follows:

$$c_0 = (A_0, A_1, \ldots, A_{16}, \alpha^{19} \times A_{17}, A_{18}, \ldots, A_{31});$$

$$c_1 = (B_0, B_1, \ldots, B_{16}, \alpha^{19} \times B_{17}, B_{18}, \ldots, B_{31}).$$

The final values of the two (2) GRS codewords may then be depicted using the previous format, where the modified $17^{th}$ term of each of the GRS codewords is underlined, as follows:

$c_0$: 24, 7, 62, 30, 32, 39, 1, 2, 50, 2, 26, 34, 44, 39, 14, 19, 38, 39, 18, 38, 62, 18, 50, 32, 42, 35, 27, 45, 0, 31, 21, 1.

$c_1$: 24, 34, 53, 34, 1, 46, 31, 48, 55, 38, 61, 12, 47, 21, 62, 56, 31, 41, 17, 14, 32, 41, 27, 52, 4, 51, 38, 40, 28, 41, 0, −1.

Step 4: there are then $2^6$ possible cosets, $(c_0) + \beta \cdot c_1$, where $\beta$ is within the Galois field, i.e., $\beta \in GF(2^6)$.

The 1-D code may be depicted as, $C_0 = <c_0>$, and the other 5 cosets may be depicted as follows:

$$C_i = C_0 + \alpha^{(i-1)} \times c_1, \text{ for } i=1,2,3,4,5.$$

The appropriate permutation matrices (being $2^6 \times 2^6$ or 64×64 in form) and subsequently the actual LDPC parity check matrix, H, may then be constructed according to the approach presented above.

Continuing on with this example of a "Root LDPC Code", the LDPC parity check matrix associated with this constructed code, GRS-H, may be found in APPENDIX A. Given the fact that the parity check matrix is so large, it is not provided here but rather in APPENDIX A.

EXAMPLE

Row and/or Column Permutation of "Root LDPC Code" (See APPENDIX B Below)

It is also noted that the LDPC parity check matrix referenced above and provided within APPENDIX A may undergo row and/or column permutation to generate a wide variety of different LDPC parity check matrices that are all included within the scope and spirit of certain aspects of the invention.

In all, there are (2048!)×(384!) (where "!" indicates "factorial") different such LDPC parity check matrices, H, that may be generated from the "Root LDPC Code" by performing various types of row and/or column permutation.

Certain aspects of the invention may be found in an LDPC code that is selected and specifically designed for use within communication systems (e.g., including the communication devices implemented therein) that are designed and implemented to be compatible with the standards and recommended practices provided by the IEEE P802.3an (10GBASE-T) Task Force.

One possible generated permutation of the "Root LDPC Code" is depicted in APPENDIX B. This LDPC parity check matrix, Hb, corresponds to the LDPC code that is being implemented according to the IEEE 802.3an (10GBASE-T) standard; this matrix is also published in "IEEE *Draft P802.3an/D2.1*".

Some of the properties of such a LDPC code of choice that is selected for use in accordance with 10GBASE-T are provided as follows:

$$GF(2^s) = GF(2^6), \text{ where } \gamma=6 \text{ and } \rho=32.$$

The parity check matrix is provided as follows:

H(6), which is a 384×2048 matrix.

This results in a (2048,1723) regular LDPC code having a code rate 0.8413 with a minimum distance, $d_{min}$, of at least 8 (i.e., $\gamma=6$, and $d_{min} \geq \gamma+2 \rightarrow d_{min} \geq 8$).

Figure 4:
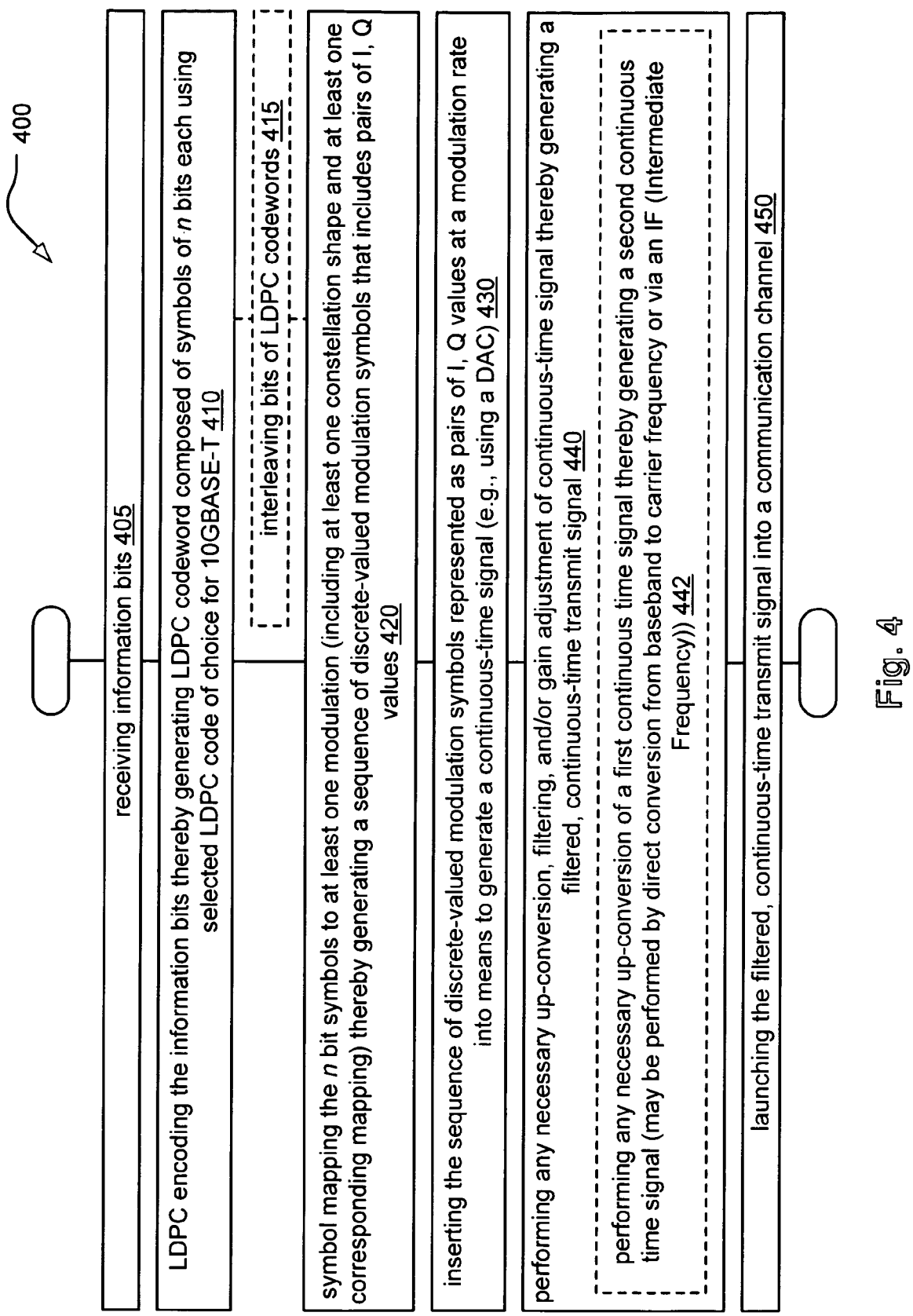
FIG. 4 is a diagram illustrating an embodiment of a method for transmit processing of an LDPC coded signal generated using a selected LDPC code of choice for 10GBASE-T according to certain aspects of the invention.

FIG. 4 is a diagram illustrating an embodiment of a method for transmit processing 400 of an LDPC coded signal generated using a selected LDPC code of choice for 10GBASE-T according to certain aspects of the invention. This diagram shows a method that may be viewed as being performed at a transmitter end of a communication channel. This method involves the generation of an LDPC coded signal using a selected LDPC code of choice for 10GBASE-T as described above with respect to other embodiments. This type of LDPC coded signal includes a GRS based LDPC coded signal (e.g., an LDPC coded signal generating using a GRS code) as described above within other of the embodiments. This LDPC coded signal may also be viewed as being an LDPC coded signal that is compliant with recommended practices provided by the IEEE (Institute of Electrical & Electronics Engineers) P802.3an (10GBASE-T) Task Force. This method also may be viewed as involving the generation of an LDPC coded signal as well as any operations to that are required to comport the LDPC coded signal to a communication channel into which a corresponding continuous-time transmit signal is to be launched.

Initially, this method involves receiving information bits, as shown in a block 405. These information bits correspond to the actual information that is desired to be transmitted from one end of a communication channel to the other. At the other end, an effort to making best estimates of these original information bits is made. Continuing on, this method involves LDPC encoding the information bits thereby generating an LDPC codeword composed of symbols of n bits each, as shown in a block 410. This encoding may be performed using a selected LDPC code of choice for 10GBASE-T; alternatively, any LDPC code constructed using a GRS code may be employed in this step without departing from the scope and spirit of the invention. In some instances, the method may also involve interleaving the bits of a LDPC codeword after encoding them using an LDPC code, as shown in a block 415.

Then, as shown in a block 420, the method continues on by symbol mapping the n bit symbols to at least one modulation (that includes at least one constellation shape and at least one corresponding mapping). In some embodiments, these n bit symbols are mapped to a number of different modulation types thereby generating a variable modulation and/or code rate signal whose modulation and/or code rate may vary as frequently as on a frame by frame basis or even as frequently as on a symbol by symbol basis. This symbol mapping of the n bit symbols to at least one modulation thereby generates a sequence of discrete-valued modulation symbols that includes pairs of I, Q values (or higher dimensional constellation). It is also noted that n is an integer. At this point, the sequence of discrete-valued modulation symbols may be viewed as being an LDPC coded modulation signal (being in completely digital form at this point).

The method then involves inserting each symbol of the sequence of discrete-valued modulation symbols represented as pairs of I, Q values (or higher order constellation values) at a modulation rate into means to generate a continuous-time signal, as shown in a block 430. For example, this may be performed using a DAC (Digital to Analog Converter).

Afterwards, once this continuous-time signal (typically at a baseband frequency) is output from the DAC or substantially equivalent means, the method may involve performing any necessary up-conversion, filtering, and/or gain adjustment of the continuous-time signal (e.g., the continuous-time baseband signal) thereby generating a filtered, continuous-time transmit signal, as shown in a block 440. There may be some instances where no up-conversion, filtering, and/or gain adjustment needs to be made, and the continuous-time signal output from a DAC or equivalent means is already in a format that comports to a communication channel (or media) into which it is to be launched (or stored). After any of the appropriate processing is performed to transform the signal into a form that comports to the communication channel (or media), it is launched therein, as shown in a block 450.

The following diagram also show methods that may be viewed as being performed at a receiver end of a communication channel. These methods involve various alternatives by which a received continuous-time signal (whose information bits have been encoded using a selected LDPC code of choice for 10GBASE-T as described above with respect to other embodiments) may be processed in an effort to make best estimates of the information bits that had been encoded therein. This received continuous-time signal may be viewed, in some embodiments, is being communication channel modified continuous-time transmit signal that had been launched into a communication channel at a transmitter end. Typically, a communication channel modifies (oftentimes undesirably) a continuous-time transmit signal that has been launched into and transmitted through it (or stored on it). Each of these 2 diagram illustrated and described below show some possible method alternatives by which the receive processing of such a received continuous-time signal (e.g., at a receiver end of a communication channel) may be performed in an effort ultimately to make best estimates of the information bits that had been encoded therein.

Figure 5:
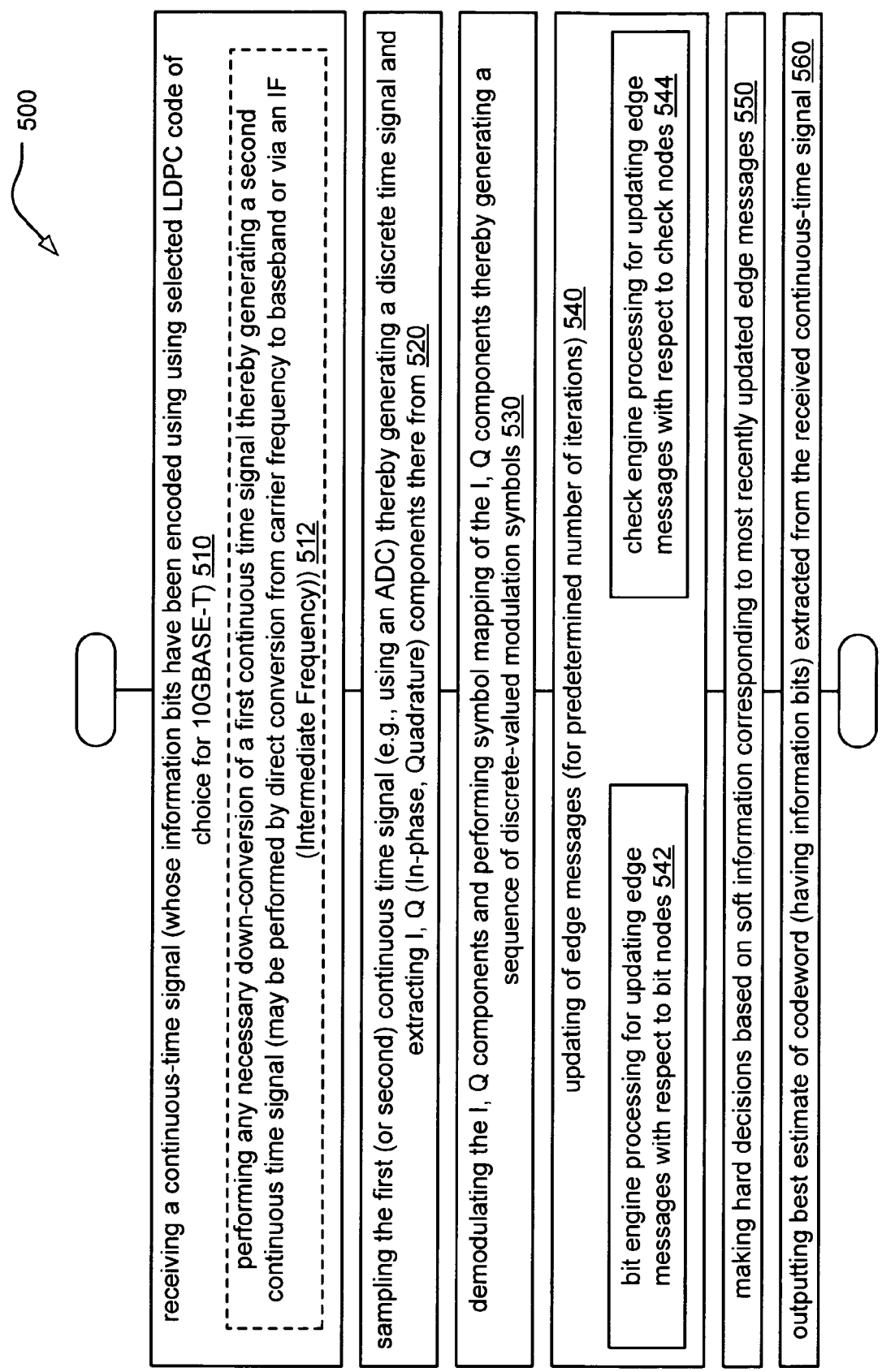
FIG. 5 is a diagram illustrating an embodiment of a method for receive processing of an LDPC coded signal that has been generated using a selected LDPC code of choice for 10GBASE-T according to certain aspects of the invention.

FIG. 5 is a diagram illustrating an embodiment of a method for receive processing 500 of an LDPC coded signal that has been generated using a selected LDPC code of choice for 10GBASE-T according to certain aspects of the invention. The method initially involves receiving a continuous-time signal, as shown in a block 510. In some embodiments, the information bits of this received continuous-time signal may have been encoded using a selected LDPC code of choice for 10GBASE-T as described above with respect to other embodiments. Alternatively, the information bits of this received continuous-time signal may have been encoded using any LDPC code constructed using a GRS code in accordance with the invention. Again, this type of LDPC coded signal includes a GRS based LDPC coded signal as described above within other of the embodiments. This receiving and processing of the continuous-time signal may also involve performing any necessary down-conversion of a first continuous-time signal thereby generating a second continuous-time signal, as shown in a block 512. Any frequency conversion that may need to be performed may possibly be performed by direct conversion from carrier frequency to a baseband frequency. This frequency conversion may alternatively be performed via an IF (Intermediate Frequency). In whichever embodiment, the received continuous-time signal is typically brought down in frequency to a baseband continuous-time signal when performing this method.

The method also involves sampling the first (or second) continuous-time signal thereby generating a discrete time signal and extracting I, Q (In-phase, Quadrature) components there from, as shown in a block 520. This sampling may be performed using an ADC (Analog to Digital Converter) or equivalent means to generate the discrete time signal from the appropriately down-converted (and potentially also filtered) received continuous-time signal. The I, Q components of the individual samples of the discrete time signal are also extracted within this step. The method then involves demodulating the I, Q components and performing symbol mapping of the I, Q components thereby generating a sequence of discrete-valued modulation symbols, as shown in a block 530.

The next step of the method of this embodiment involves performing updating of edge messages for a predetermined number of iterations, as shown in a block 540. This step may be viewed as performing the LDPC decoding in accordance with any of the various embodiments described above. This LDPC decoding generally involves bit engine processing for updating edge messages with respect to bit nodes (as shown in a block 542) as well as check engine processing for updating edge messages with respect to check nodes (as shown in a block 544).

After the final decoding iteration of the predetermined number of decoding iterations, the method involves making hard decisions based on soft information corresponding to most recently updated edge messages with respect to the bit nodes, as shown in a block 550. The method ultimately involves outputting a best estimate of the codeword (that includes the information bits) that has been extracted from the received continuous-time signal, as shown in a block 560.

Figure 6:
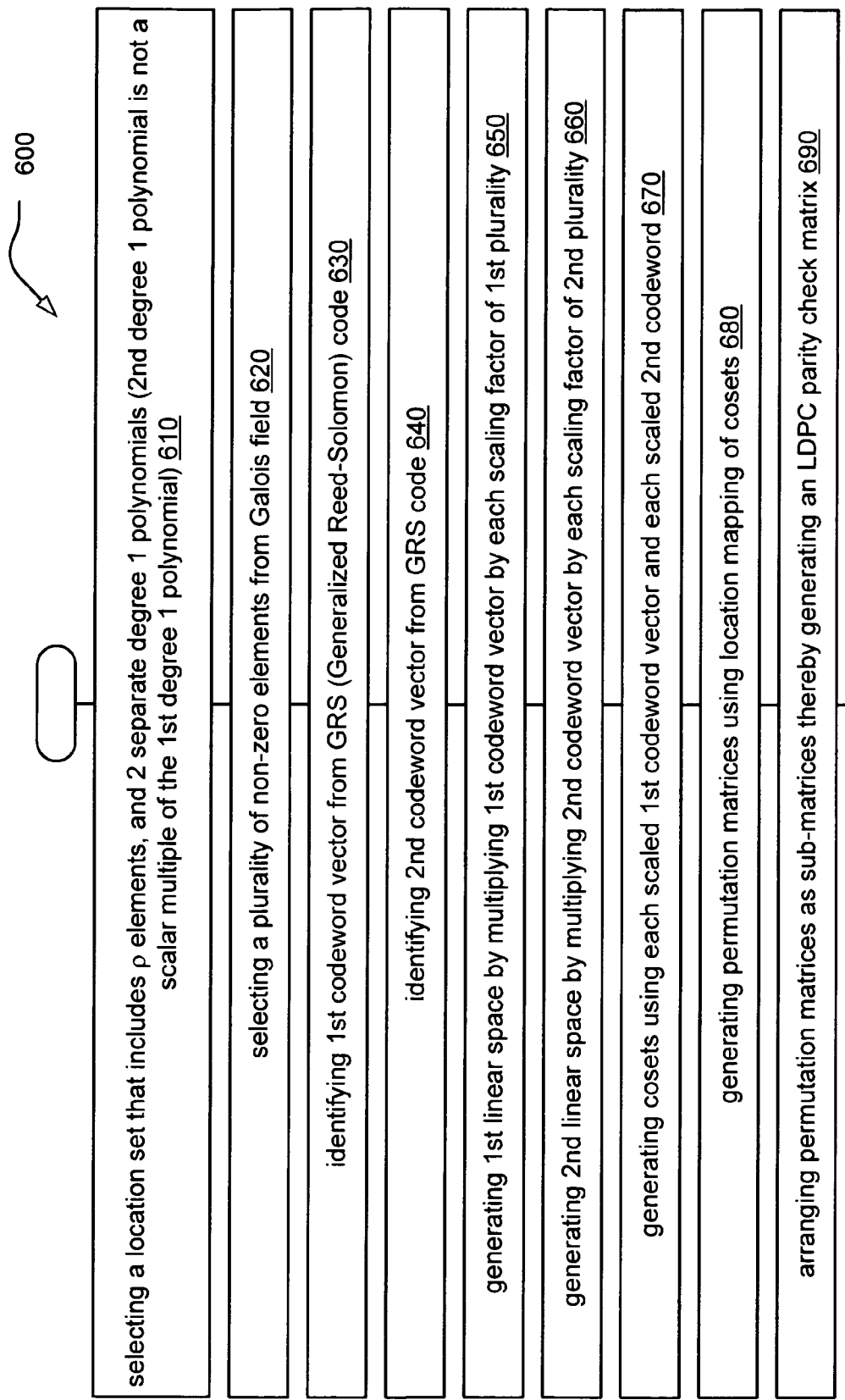
FIG. 6 is a diagram illustrating an embodiment of a method for constructing an LDPC (Low Density Parity Check) code using a GRS (Generalized Reed-Solomon) code according to certain aspects of the invention.

FIG. 6 is a diagram illustrating an embodiment of a method 600 for constructing an LDPC (Low Density Parity Check) code using a GRS (Generalized Reed-Solomon) code according to certain aspects of the invention.

Initially, this method 600 operates by selecting a location set, as shown in a block 610. This location set includes a number of elements such that each of theses elements may be generated using a primitive element (e.g., $\alpha$) of a Galois field (e.g., $GF(2^s)$) such that each of the primitive elements (e.g., $\alpha$) is raised to a corresponding exponent. For example, the location set may be represented as $L=\{\alpha^{i_0}, \ldots, \alpha^{i_{p-1}}\}$. Also, a Galois field may be viewed as a field having a predetermined finite number of elements. In the digital communication context, the use of a Galois field is common, in that, it is the finite space in which the various codes, coded signals, and/or components thereof, are generated. The location set also includes two separate degree 1 polynomial functions (e.g., a first degree 1 polynomial function and a second degree 1 polynomial function). The first degree 1 polynomial function is operable to map each element of the plurality of elements of the location set to a corresponding non-zero value, and the second degree 1 polynomial function that is a non-linear scalar multiple of the first degree 1 polynomial function. That is to say, for all of the scalar values (e.g., β) within the location set, neither of these second degree 1 polynomial functions may be scaled to be the other.

Then, as shown in a block 620, the method 600 continues by selecting a plurality of non-zero elements from the Galois field. These non-zero elements may be used later to generate each of the codeword vectors identified with respect to a GRS (Generalized Reed-Solomon) code. The method 600 then continues, as shown in a block 630, by identifying a first codeword vector of a GRS code, from among a plurality of possible codeword vector values. This first codeword vector may be generated using the plurality of non-zero elements and resultants generated by mapping each element of the plurality of elements of the location set (e.g., $L=\{\alpha^{i_0}, \ldots, \alpha^{i_{p-1}}\}$) according to the first degree 1 polynomial function (e.g. $f_0$). The method 600 then continues, as shown in a block 640, by identifying a second codeword vector of the GRS code, from among the plurality of possible codeword vector values. This second codeword vector similarly may be generated using the plurality of non-zero elements and resultants generated by mapping each element of the plurality of elements of the location set according to the second degree 1 polynomial function.

As shown in a block 650, the method 600 then continues by multiplying the first codeword vector by each scaling factor of a first plurality of scaling factors thereby generating a plurality of scaled first codeword vectors. Also, as shown in a block 660, the method 600 then continues by also multiplying the second codeword vector by each scaling factor of a second plurality of scaling factors thereby generating a plurality of scaled second codeword vectors.

These actions, as shown within the blocks 650 and 660 may be viewed as spanning each of the first codeword vector and the second codeword vector (e.g., $c_0$ and $c_1$) across the Galois field. For example, for $2^s$ different values of β, the first codeword vector, $c_0$, undergoes a 1-dimensional spanning across the Galois field (e.g., $(c_0)=\lfloor \beta \cdot c_0, \beta$ any element of $GF(2^s) \rfloor$. Again, there is a total of $2^s$ possible values for β within the Galois field. It is noted that the grouped of scaled codeword vectors, the set ($c_0$), may be viewed as being a 1-dimensional code that is generalized by the first codeword vector, $c_0$.

Similarly, for $2^s$ different values of β, the second codeword vector, $c_1$, undergoes a 1-dimensional spanning across the Galois field (e.g., $(c_1)=\lfloor \beta \cdot c_1, \beta$ any element of $GF(2^s) \rfloor$. In addition, a second set, ($c_1$), may also be viewed as being a 1-dimensional code that is generalized by the second codeword vector, $c_1$.

The method 600 then continues, as shown in a block 670, by generating a plurality of cosets by adding each scaled first codeword vector of the plurality of scaled first codeword vectors to each plurality of scaled second codeword vectors of the plurality of scaled second codeword vectors. In other words, once the set of scaled first codeword vectors, ($c_0$), is determined, then various values of a scaling factor, β, are employed to generate each of the cosets. There are then $2^s$ possible cosets, ($c_0$)+β·$c_1$. These cosets may be represented as follows:

Cosets $C^{(i)}=\{c_1, c_2, \ldots, c_{2^s-1}\}$, such that each $c_k=\{c_{k,0}, c_{k,1}, \ldots, c_{k,\rho}\}$ The method 600 then continues, as shown in a block 680, by generating a plurality of permutation matrices. Each permutation matrix includes a plurality of rows such that each row of the plurality of rows comprises a location mapping of one coset of the plurality of cosets.

One possible location mapping that may be employed is shown as follows:

Location map: using the Galois field, $GF(2^s) \rightarrow \{0,1\}^{2^s}$ $z(0)=(100 \ldots 0)$, $z(1)=(010 \ldots 0)$, $z(\alpha)=(001 \ldots 0), \ldots$ $z(\alpha^i)=(000 \ldots 010 \ldots 0)$, where 1 is in the i+2-th position.

Each of the $2^s \times 2^s$ permutation matrices take the form as shown below as follows:

$$P_{i,k} = \begin{bmatrix} z(c_{k,0}) \\ z(c_{k,1}) \\ \vdots \\ z(c_{k,2^s-1}) \end{bmatrix}$$

Once each of these permutation matrices has been formed, the method 600 then continues, as shown in a block 690, by arranging each permutation matrix as sub-matrices thereby generating an LDPC parity check matrix that corresponds to the LDPC code. The LDPC code may be generated by constructing an LDPC matrix that takes the following form:

$$H(\gamma) = \begin{bmatrix} P_{1,1} & P_{1,2} & \cdots & P_{1,\rho} \\ P_{2,1} & P_{2,2} & \cdots & P_{2,\rho} \\ \vdots & \vdots & \ddots & \vdots \\ P_{\gamma,1} & P_{\gamma,2} & \cdots & P_{\gamma,\rho} \end{bmatrix}$$

Some of the properties of the LDPC parity check matrix are provided as follows:

1. every column has a weight of γ
2. every row has a weight of ρ
3. no two rows have mode than 1-component in common Also, the bit node degree of such an LDPC code constructed using this approach is γ, and the check node degree of such an LDPC code constructed using this approach is ρ.

The minimum distance, $d_{min}$, of such an LDPC code is provided as follows:

$$d_{min} \geq \begin{cases} \gamma+2 & \text{even } \gamma \\ \gamma+1 & \text{odd } \gamma \end{cases}$$

By using a GRS code (instead of merely a RS (Reed-Solomon) code), a much wider variety of LDPC codes may be generated than described within anything within the prior art.

It is also noted that the LDPC parity check matrix, H(γ), may be employed to construct a generator matrix, G, that may be employed by an LDPC encoder to encode at least one information bit thereby generating at least one encoded bit.

Figure 7:
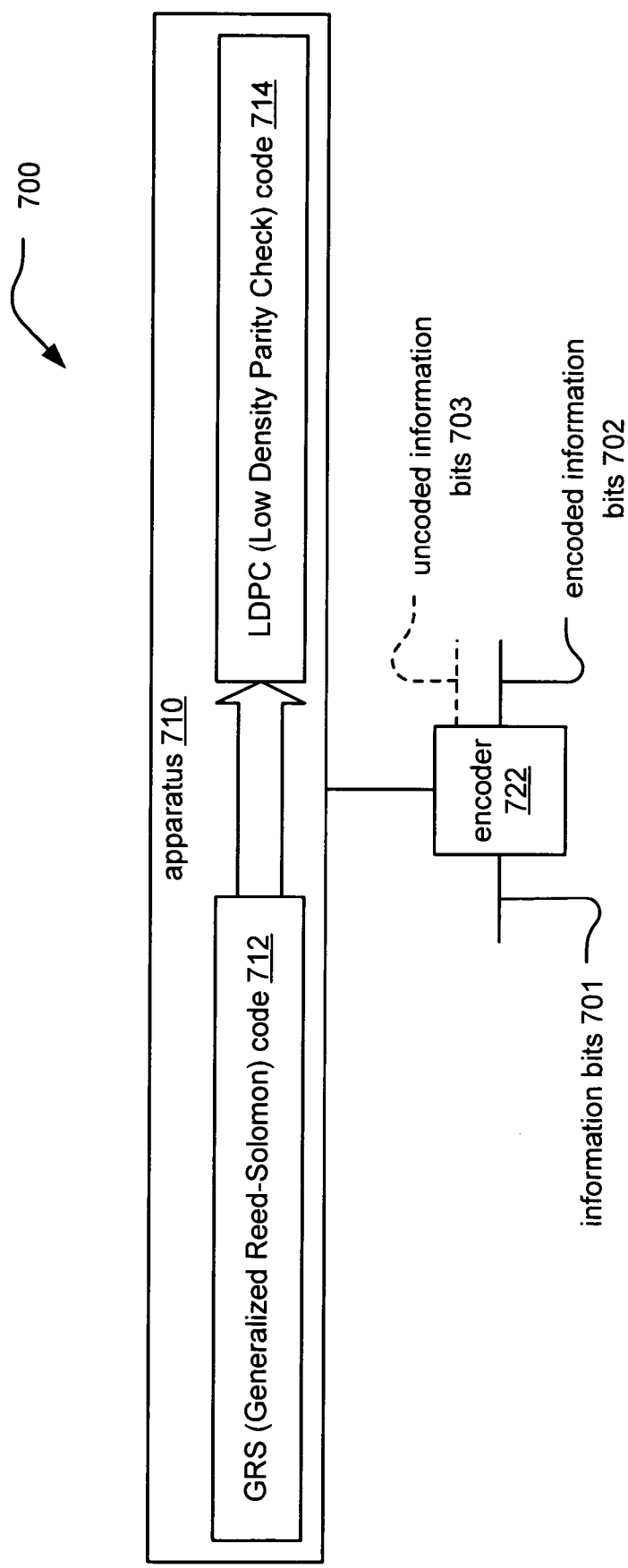
FIG. 7 is a diagram illustrating an embodiment of an apparatus that is operable to construct an LDPC code using a GRS code according to certain aspects of the invention.

FIG. 7 is a diagram illustrating an embodiment 700 of an apparatus that is operable to construct an LDPC code using a GRS code according to certain aspects of the invention. This embodiment shows pictorially how an apparatus 710 may be constructed to perform construction of an LDPC code (as shown in a block 714) using a GRS code (as shown in a block 712).

Once the apparatus 710 generates the LDPC code 714, it may be provided to an encoder 722 that is operable to perform encoding of information bits 701 to generate encoded information bits 702. In some embodiments, the encoder 701 also outputs uncoded bits 703 that have not undergone LDPC encoding.

It is also noted a decoder could alternatively be communicatively coupled to receive the LDPC code 714 generated by the apparatus 710 without departing from the scope and spirit of the invention. Devices at each end of a communication channel may employ the same LDPC code 714 that is constructed using the GRS code 712.

Figure 8:
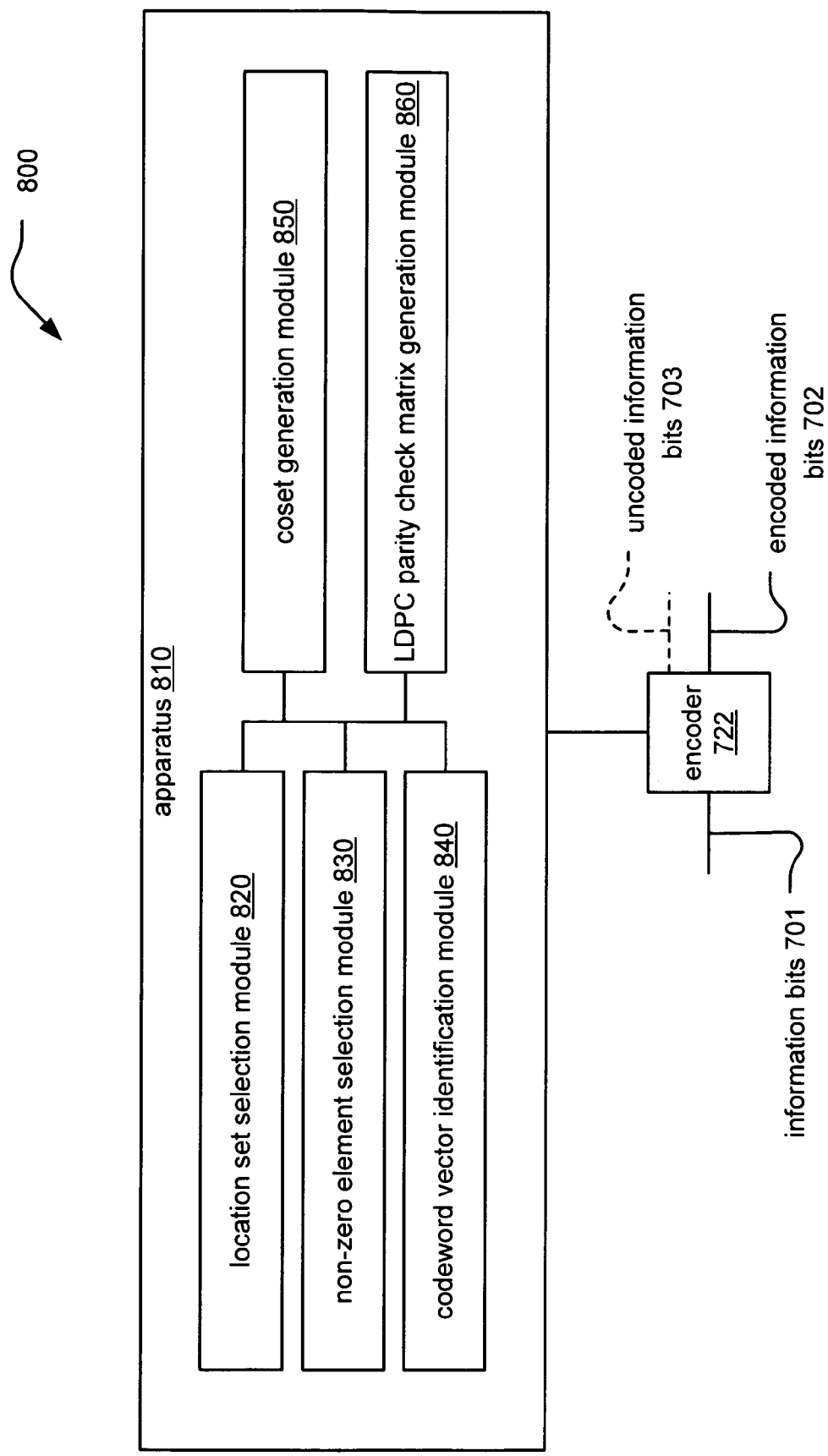
FIG. 8 is a diagram illustrating an alternative embodiment of an apparatus that is operable to construct an LDPC code using a GRS code according to certain aspects of the invention.

FIG. 8 is a diagram illustrating an alternative embodiment 800 of an apparatus that is operable to construct an LDPC code using a GRS code according to certain aspects of the invention. This embodiment shows some of the various functional blocks (and/or modules) that may be employed within such an apparatus 810.

The apparatus 810 is operable to construct an LDPC code using a GRS code. The apparatus 810 includes a location set selection module 820 that is operable to select a location set and a non-zero element selection module 830 that is operable to select a plurality of non-zero elements from the Galois field.

The apparatus 810 may also be implemented to include a codeword vector identification module 840 that is operable to identify a first codeword vector of a GRS code, from among a plurality of possible codeword vector values. The codeword vector identification module 840 is also operable to identify a second codeword vector of the GRS code, from among the plurality of possible codeword vector values.

The apparatus 810 may also be implemented to include a coset generation module 850 that is operable to multiply the first codeword vector by each scaling factor of a first plurality of scaling factors thereby generating a plurality of scaled first codeword vectors, and to multiply the second codeword vector by each scaling factor of a second plurality of scaling factors thereby generating a plurality of scaled second codeword vectors. The coset generation module 850 may also be implemented to generate a plurality of cosets by adding each scaled first codeword vector of the plurality of scaled first codeword vectors to each plurality of scaled second codeword vectors of the plurality of scaled second codeword vectors.

The apparatus 810 may also be implemented to include an LDPC parity check matrix generation module 860 that is operable to generate a plurality of permutation matrices, wherein each permutation matrix of the plurality of permutation matrices comprises a plurality of rows such that each row of the plurality of rows comprises a location mapping of one coset of the plurality of cosets. The LDPC parity check matrix generation module 860 may also be implemented to arrange each permutation matrix of the plurality of permutation matrices as sub-matrices thereby generating an LDPC parity check matrix that corresponds to the LDPC code.

This apparatus 810 may also be communicatively coupled the encoder 722 that is operable to perform encoding of information bits 701 to generate encoded information bits 702. Again, the encoder 701 outputs uncoded bits 703 that have not undergone LDPC encoding. As described within the previous embodiment, it is also noted a decoder could alternatively be communicatively coupled to receive the LDPC code 714 generated by the apparatus 810 without departing from the scope and spirit of the invention. Devices at each end of a communication channel may employ the same LDPC code that is constructed using the GRS code.

It is also noted that the methods described within the preceding figures may also be performed within any of the appropriate system and/or apparatus designs (communication systems, communication transmitters, communication receivers, communication transceivers, and/or functionality described therein) that are described above without departing from the scope and spirit of the invention.

Moreover, it is also noted that the various functionality, system and/or apparatus designs, and method related embodiments that are described herein may all be implemented in the logarithmic domain (e.g., log domain) thereby enabling multiplication operations to be performed using addition and division operations to be performed using subtraction.

In view of the above detailed description of the invention and associated drawings, other modifications and variations will now become apparent. It should also be apparent that such other modifications and variations may be effected without departing from the spirit and scope of the invention.

What is claimed is:

1. A method for constructing an LDPC (Low Density Parity Check) code using a GRS (Generalized Reed-Solomon) code, the method comprising:
   selecting a location set that comprises:
      a plurality of elements, wherein each element of the plurality of elements is generated using a primitive element of a Galois field raised to a corresponding exponent, and wherein the Galois field comprises a predetermined finite number of elements;
      a first degree 1 polynomial function that is operable to map each element of the plurality of elements of the location set to a corresponding non-zero value; and
      a second degree 1 polynomial function that is a non-linear scalar multiple of the first degree 1 polynomial function;
   selecting a plurality of non-zero elements from the Galois field;
   identifying a first codeword vector of a GRS code, from among a plurality of possible codeword vector values, wherein the first codeword vector is generated using the plurality of non-zero elements and resultants generated by mapping each element of the plurality of elements of the location set according to the first degree 1 polynomial function;
   identifying a second codeword vector of the GRS code, from among the plurality of possible codeword vector values, wherein the second codeword vector is generated using the plurality of non-zero elements and resultants generated by mapping each element of the plurality of elements of the location set according to the second degree 1 polynomial function;

multiplying the first codeword vector by each scaling factor of a first plurality of scaling factors thereby generating a plurality of scaled first codeword vectors;

multiplying the second codeword vector by each scaling factor of a second plurality of scaling factors thereby generating a plurality of scaled second codeword vectors;

generating a plurality of cosets by adding each scaled first codeword vector of the plurality of scaled first codeword vectors to each plurality of scaled second codeword vectors of the plurality of scaled second codeword vectors;

generating a plurality of permutation matrices, wherein each permutation matrix of the plurality of permutation matrices comprises a plurality of rows such that each row of the plurality of rows comprises a location mapping of one coset of the plurality of cosets; and arranging each permutation matrix of the plurality of permutation matrices as sub-matrices thereby generating an LDPC parity check matrix that corresponds to the LDPC code;

and wherein:

the method is performed with an apparatus that provides the generated LDPC parity check matrix to at least one of an encoder and a decoder.

2. The method of claim 1, wherein:

the predetermined finite number of elements of the Galois field comprises $2^s$ elements such that s is an integer;

the plurality of cosets comprises $2^s$ cosets; and each permutation matrix of the plurality of permutation matrices is a $2^s \times 2^s$ permutation matrix.

3. The method of claim 1, wherein:

the predetermined finite number of elements of the Galois field comprises $2^s$ elements such that s is an integer;

the LDPC parity check matrix comprises $\gamma \times \rho$ permutation matrices arranged as sub-matrices such that $\gamma$ and $\rho$ are integers; and $\rho$ is less than or equal to $2^s$.

4. The method of claim 1, wherein:

the predetermined finite number of elements of the Galois field comprises $2^s$ elements such that s is an integer;

the LDPC parity check matrix comprises $\gamma \times \rho$ permutation matrices arranged as sub-matrices such that $\gamma$ and $\rho$ are integers;

the LDPC parity check matrix has a bit node degree of $\gamma$ and a check node degree of $\rho$;

each column of the LDPC parity check matrix comprises a weight of $\gamma$;

each row of the LDPC parity check matrix comprises a weight of $\rho$; and $\rho$ is less than or equal to $2^s$.

5. The method of claim 1, wherein:

the predetermined finite number of elements of the Galois field comprises $2^6$ elements;

the LDPC parity check matrix is a 384×2048 matrix;

the LDPC code is a (2048,1723) regular LDPC code that comprises a code rate of approximately 0.8413; and a minimum distance of the LDPC code is greater than or equal to 8.

6. The method of claim 1, wherein:

the predetermined finite number of elements of the Galois field comprises $2^s$ elements such that s is an integer;

the first plurality of scaling factors comprises $2^s$ scaling factors; and the second plurality of scaling factors comprises $2^s$ scaling factors.

7. The method of claim 1, wherein:

the LDPC parity check matrix comprises $\gamma \times \rho$ permutation matrices arranged as sub-matrices such that $\gamma$ and $\rho$ are integers;

the plurality of elements of the location set comprises $\rho$ elements; and the plurality of non-zero elements comprises $\rho$ elements.

8. The method of claim 1, wherein:

the LDPC parity check matrix comprises $\gamma \times \rho$ permutation matrices arranged as sub-matrices such that $\gamma$ and $\rho$ are integers;

a minimum distance of the LDPC code is greater than or equal to $\gamma+2$ when $\gamma$ is an even integer; and the minimum distance of the LDPC code is greater than or equal to $\gamma+1$ when $\gamma$ is an odd integer.

9. The method of claim 1, wherein:

the first plurality of scaling factors is the second plurality of scaling factors.

10. The method of claim 1, wherein:

the LDPC code is operable to generate LDPC coded signals that are compliant with recommended practices provided by IEEE (Institute of Electrical & Electronics Engineers) P802.3an (10GBASE-T) Task Force.

11. The method of claim 10, wherein:

the LDPC parity check matrix that corresponds to the LDPC code is a 384×2048 LDPC parity check matrix, Hb, as provided within Appendix B.

12. A method for constructing an LDPC (Low Density Parity Check) code using a GRS (Generalized Reed-Solomon) code, the method comprising:

identifying a first codeword vector of a GRS code, from among a plurality of possible codeword vector values;

identifying a second codeword vector of the GRS code, from among the plurality of possible codeword vector values;

multiplying the first codeword vector by each scaling factor of a first plurality of scaling factors thereby generating a plurality of scaled first codeword vectors;

multiplying the second codeword vector by each scaling factor of a second plurality of scaling factors thereby generating a plurality of scaled second codeword vectors;

generating a plurality of cosets by adding each scaled first codeword vector of the plurality of scaled first codeword vectors to each plurality of scaled second codeword vectors of the plurality of scaled second codeword vectors;

generating a plurality of permutation matrices, wherein each permutation matrix of the plurality of permutation matrices comprises a plurality of rows such that each row of the plurality of rows comprises a location mapping of one coset of the plurality of cosets; and arranging each permutation matrix of the plurality of permutation matrices as sub-matrices thereby generating an LDPC parity check matrix that corresponds to the LDPC code;

and wherein:

the method is performed within an apparatus that provides the generated LDPC parity check matrix to at least one of an encoder and a decoder.

13. The method of claim 12, further comprising:

selecting a location set that comprises:

a plurality of elements, wherein each element of the plurality of elements is generated using a primitive element of a Galois field raised to a corresponding exponent, and wherein the Galois field comprises a predetermined finite number of elements;

a first degree 1 polynomial function that is operable to map each element of the plurality of elements of the location set to a corresponding non-zero value; and a second degree 1 polynomial function that is a non-linear scalar multiple of the first degree 1 polynomial function;

selecting a plurality of non-zero elements from the Galois field; and wherein:

the first codeword vector is generated using the plurality of non-zero elements and resultants generated by mapping each element of the plurality of elements of the location set according to the first degree 1 polynomial function; and the second codeword vector is generated using the plurality of non-zero elements and resultants generated by mapping each element of the plurality of elements of the location set according to the second degree 1 polynomial function.

14. The method of claim 13, wherein:
the predetermined finite number of elements of the Galois field comprises $2^s$ elements such that s is an integer;
the plurality of cosets comprises $2^s$ cosets;
each permutation matrix of the plurality of permutation matrices is a $2^s \times 2^s$ permutation matrix;
the LDPC parity check matrix comprises $\gamma \times \rho$ permutation matrices arranged as sub-matrices such that $\gamma$ and $\rho$ are integers;
the LDPC parity check matrix has a bit node degree of $\gamma$ and a check node degree of $\rho$;
each column of the LDPC parity check matrix comprises a weight of $\gamma$;
each row of the LDPC parity check matrix comprises a weight of $\rho$; and
$\rho$ is less than or equal to $2^s$.

15. The method of claim 13, wherein:
the predetermined finite number of elements of the Galois field comprises $2^6$ elements;
the LDPC parity check matrix is a 384×2048 matrix;
the LDPC code is a (2048,1723) regular LDPC code that comprises a code rate of approximately 0.8413; and
a minimum distance of the LDPC code is greater than or equal to 8.

16. The method of claim 13, wherein:
the predetermined finite number of elements of the Galois field comprises $2^s$ elements such that s is an integer;
the first plurality of scaling factors comprises $2^s$ scaling factors; and
the second plurality of scaling factors comprises $2^s$ scaling factors.

17. The method of claim 13, wherein:
the LDPC parity check matrix comprises $\gamma \times \rho$ permutation matrices arranged as sub-matrices such that $\gamma$ and $\rho$ are integers;
the plurality of elements of the location set comprises $\rho$ elements; and
the plurality of non-zero elements comprises $\rho$ elements.

18. The method of claim 12, wherein:
the LDPC parity check matrix comprises $\gamma \times \rho$ permutation matrices arranged as sub-matrices such that $\gamma$ and $\rho$ are integers;
a minimum distance of the LDPC code is greater than or equal to $\gamma+2$ when $\gamma$ is an even integer;
the minimum distance of the LDPC code is greater than or equal to $\gamma+1$ when $\gamma$ is an odd integer.

19. The method of claim 12, wherein:
the LDPC code is operable to generate LDPC coded signals that are compliant with recommended practices provided by IEEE (Institute of Electrical & Electronics Engineers) P802.3an (10GBASE-T) Task Force.

20. The method of claim 19, wherein:
the LDPC parity check matrix that corresponds to the LDPC code is a 384×2048 LDPC parity check matrix, Hb, as provided within Appendix B.

21. An apparatus that is operable to construct an LDPC (Low Density Parity Check) code using a GRS (Generalized Reed-Solomon) code, the apparatus comprising:
a codeword vector identification module that is operable to:
identify a first codeword vector of a GRS code, from among a plurality of possible codeword vector values; and
identify a second codeword vector of the GRS code, from among the plurality of possible codeword vector values;
a coset generation module that is operable to:
multiply the first codeword vector by each scaling factor of a first plurality of scaling factors thereby generating a plurality of scaled first codeword vectors;
multiply the second codeword vector by each scaling factor of a second plurality of scaling factors thereby generating a plurality of scaled second codeword vectors; and
generate a plurality of cosets by adding each scaled first codeword vector of the plurality of scaled first codeword vectors to each plurality of scaled second codeword vectors of the plurality of scaled second codeword vectors;
an LDPC parity check matrix generation module that is operable to:
generate a plurality of permutation matrices, wherein each permutation matrix of the plurality of permutation matrices comprises a plurality of rows such that each row of the plurality of rows comprises a location mapping of one coset of the plurality of cosets; and
arrange each permutation matrix of the plurality of permutation matrices as sub-matrices thereby generating an LDPC parity check matrix that corresponds to the LDPC code.

22. The apparatus of claim 21, further comprising:
a location set selection module that is operable to select a location set that comprises:
a plurality of elements, wherein each element of the plurality of elements is generated using a primitive element of a Galois field raised to a corresponding exponent, and wherein the Galois field comprises a predetermined finite number of elements;
a first degree 1 polynomial function that is operable to map each element of the plurality of elements of the location set to a corresponding non-zero value; and
a second degree 1 polynomial function that is a non-linear scalar multiple of the first degree 1 polynomial function; and
a non-zero element selection module that is operable to select a plurality of non-zero elements from the Galois field; and wherein:
the first codeword vector is generated using the plurality of non-zero elements and resultants generated by mapping each element of the plurality of elements of the location set according to the first degree 1 polynomial function; and
the second codeword vector is generated using the plurality of non-zero elements and resultants generated by mapping each element of the plurality of elements of the location set according to the second degree 1 polynomial function.

23. The apparatus of claim 22, wherein:
the predetermined finite number of elements of the Galois field comprises $2^s$ elements such that s is an integer;
the plurality of cosets comprises $2^s$ cosets;
each permutation matrix of the plurality of permutation matrices is a $2^s \times 2^s$ permutation matrix;
the LDPC parity check matrix comprises $\gamma \times \rho$ permutation matrices arranged as sub-matrices such that $\gamma$ and $\rho$ are integers;
the LDPC parity check matrix has a bit node degree of $\gamma$ and a check node degree of $\rho$;
each column of the LDPC parity check matrix comprises a weight of $\gamma$;
each row of the LDPC parity check matrix comprises a weight of $\rho$; and
$\rho$ is less than or equal to $2^s$.

24. The apparatus of claim 22, wherein:
the predetermined finite number of elements of the Galois field comprises $2^6$ elements;
the LDPC parity check matrix is a 384×2048 matrix;
the LDPC code is a (2048,1723) regular LDPC code that comprises a code rate of approximately 0.8413; and
a minimum distance of the LDPC code is greater than or equal to 8.

25. The apparatus of claim 22, wherein:
the predetermined finite number of elements of the Galois field comprises $2^s$ elements such that s is an integer;
the first plurality of scaling factors comprises $2^s$ scaling factors; and
the second plurality of scaling factors comprises $2^s$ scaling factors.

26. The apparatus of claim 22, wherein:
the LDPC parity check matrix comprises $\gamma \times \rho$ permutation matrices arranged as sub-matrices such that $\gamma$ and $\rho$ are integers;
the plurality of elements of the location set comprises $\rho$ elements; and
the plurality of non-zero elements comprises $\rho$ elements.

27. The apparatus of claim 21, wherein:
the LDPC parity check matrix comprises $\gamma \times \rho$ permutation matrices arranged as sub-matrices such that $\gamma$ and $\rho$ are integers;
a minimum distance of the LDPC code is greater than or equal to $\gamma+2$ when $\gamma$ is an even integer;
the minimum distance of the LDPC code is greater than or equal to $\gamma+1$ when $\gamma$ is an odd integer.

28. The apparatus of claim 21, wherein:
the apparatus is communicatively coupled to an LDPC encoder;
the LDPC encoder is operable to encode at least one information bit, using the LDPC code constructed by the apparatus, thereby generating an LDPC coded signal that is compliant with recommended practices provided by IEEE (Institute of Electrical & Electronics Engineers) P802.3an (10GBASE-T) Task Force.

29. The apparatus of claim 28, wherein:
the LDPC parity check matrix that corresponds to the LDPC code is a 384×2048 LDPC parity check matrix, Hb, as provided within Appendix B.

* * * * *